(12) United States Patent  
Masago et al.

(10) Patent No.: US 10,779,424 B2  
(45) Date of Patent: Sep. 15, 2020

(54) SENSOR CASE

(71) Applicant: BRIDGESTONE CORPORATION, Tokyo (JP)

(72) Inventors: Takeshi Masago, Tokyo (JP); Kazuo Hayashi, Tokyo (JP)

(73) Assignee: BRIDESTONE CORPORATION, Chuo-ku, Tokyo (JP)

( * ) Notice: Subject to any disclaimer, the term of this patent is extended or adjusted under 35 U.S.C. 154(b) by 0 days.

(21) Appl. No.: 16/316,738

(22) PCT Filed: Jul. 28, 2017

(86) PCT No.: PCT/JP2017/027554  
§ 371 (c)(1),  
(2) Date: Jan. 10, 2019

(87) PCT Pub. No.: WO2018/021564  
PCT Pub. Date: Feb. 1, 2018

(65) Prior Publication Data  
US 2019/0307003 A1 Oct. 3, 2019

(30) Foreign Application Priority Data

Jul. 29, 2016 (JP) ................................. 2016-150531

(51) Int. Cl.  
*H05K 5/02* (2006.01)  
*B60C 23/04* (2006.01)  
*B60C 19/00* (2006.01)

(52) U.S. Cl.  
CPC ........... *H05K 5/0217* (2013.01); *B60C 19/00* (2013.01); *B60C 23/04* (2013.01); *B60C 23/0493* (2013.01)

(58) Field of Classification Search  
CPC ...... H05K 5/0217; B60C 23/04; B60C 19/00; B60C 23/0493  
See application file for complete search history.

(56) References Cited

U.S. PATENT DOCUMENTS

2004/0118196 A1 6/2004 Landes et al.  
2006/0201241 A1* 9/2006 Durif .................. B60C 23/0493  
73/146

(Continued)

FOREIGN PATENT DOCUMENTS

| CN | 103038072 A | 4/2013 |
| CN | 103879243 A | 6/2014 |
| CN | 103958223 A | 7/2014 |
| CN | 104220278 A | 12/2014 |

(Continued)

OTHER PUBLICATIONS

International Preliminary Report on Patentability with English Translation of Written Opinion of PCT/JP2017/027554 dated Feb. 7, 2019.

(Continued)

*Primary Examiner* — Abhishek M Rathod  
(74) *Attorney, Agent, or Firm* — Sughrue Mion, PLLC

(57) ABSTRACT

A sensor case (10) with a sensor housed therein for obtaining information on a tire, including a lower side member (11) having a bottom surface (11b) to be attached on an inner surface of the tire or to a base (20) for mounting the sensor case (10) on the inner surface of the tire, and an upper side member (12) protruding from a surface (11a) opposite to the bottom surface (11b) of the lower side member (11) to a side opposite to the bottom surface (11b) and having a width smaller than a width of the lower side member (11). A side surface (11c) of the lower side member (11) is formed of a curved surface convex outwardly in a width direction, and a side surface (12c) of the upper side member (12) and a top surface (12a) of the upper side member (12), which is a surface opposite to the bottom surface (11b), are connected by a curved surface (12p) being in contact with the top surface (12a).

8 Claims, 5 Drawing Sheets

(56) References Cited

U.S. PATENT DOCUMENTS

| | | | |
|---|---|---|---|
| 2006/0220816 A1* | 10/2006 | Scheungraber | B60C 23/0493 340/447 |
| 2007/0018804 A1 | 1/2007 | Strache et al. | |
| 2007/0103285 A1 | 5/2007 | Konno et al. | |
| 2007/0229374 A1 | 10/2007 | Shimura | |
| 2009/0183562 A1* | 7/2009 | Brusarosco | B60C 23/0493 73/146.5 |
| 2011/0292630 A1* | 12/2011 | Yamaguchi | B60C 23/0493 361/807 |
| 2013/0025751 A1 | 1/2013 | Dassano et al. | |
| 2013/0081457 A1 | 4/2013 | Wilson et al. | |
| 2013/0223087 A1* | 8/2013 | Mueller | B60R 13/0243 362/511 |
| 2014/0174619 A1 | 6/2014 | Hinque | |
| 2014/0352420 A1* | 12/2014 | Brusarosco | B60C 23/0493 73/146.5 |
| 2015/0122006 A1 | 5/2015 | Yamaguchi | |
| 2017/0057304 A1* | 3/2017 | So | B60C 23/0493 |
| 2017/0066294 A1 | 3/2017 | Nagaya | |

FOREIGN PATENT DOCUMENTS

| | | |
|---|---|---|
| DE | 10 2014 213 060 A1 | 1/2016 |
| EP | 1195272 A2 | 4/2002 |
| JP | 2004-330842 A | 11/2004 |
| JP | 2005-348032 A | 12/2005 |
| JP | 2014-122023 A | 7/2014 |
| JP | 2015-160512 A | 9/2015 |
| WO | 2010/067580 A1 | 6/2010 |
| WO | 2015/019283 A1 | 2/2015 |
| WO | WO-2015129453 A1 * 9/2015 ......... B60C 23/0493 |

OTHER PUBLICATIONS

International Search Report of PCT/JP2017/027554 dated Oct. 24, 2017 [PCT/ISA/210].

Communication dated Apr. 2, 2019, from the European Patent Office in counterpart European Application No. 17834566.6.

Communication dated Apr. 23, 2020. from the State Intellectual Property Office of the P.R.C in application No. 201780047281.

* cited by examiner

FIG. 5A
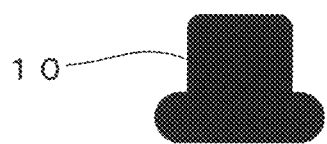 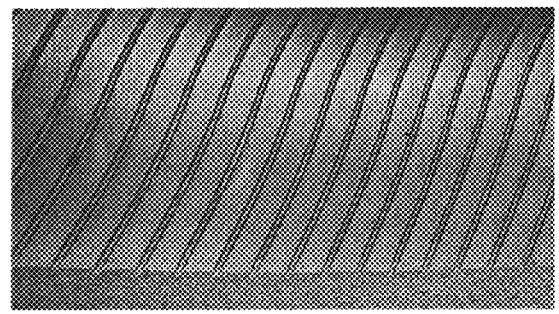
FIG. 5B
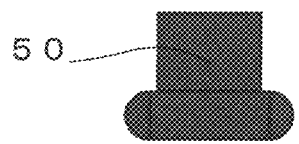 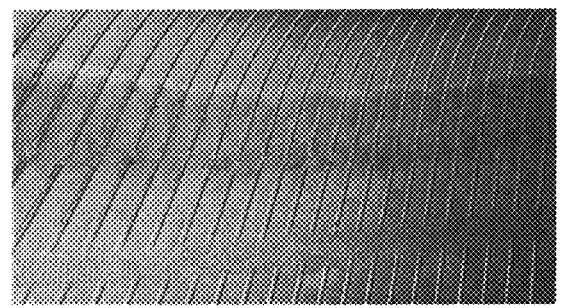
FIG. 6A FIG. 6B
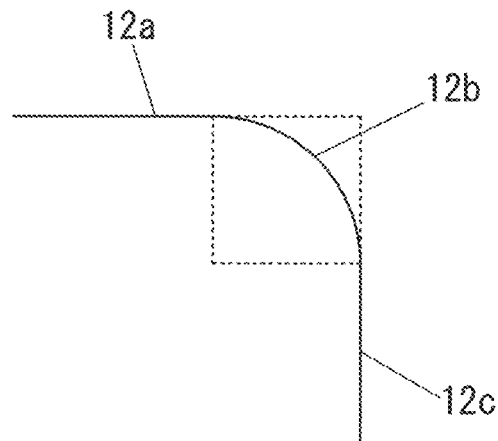 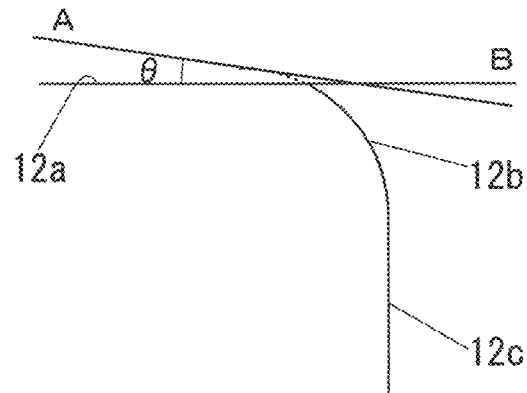

SENSOR CASE

CROSS REFERENCE TO RELATED APPLICATIONS

This application is a National Stage of International Application No. PCT/JP2017/027554, filed Jul. 28, 2017, claiming priority based on Japanese Patent Application No. 2016-150531, filed Jul. 29, 2016.

TECHNICAL FIELD

The present invention relates to a sensor case with a sensor housed therein for obtaining information on a tire.

BACKGROUND

There has been known a technique in which a sensor case with a sensor module housed therein is attached on an inner surface of a tire via a rubber base, the sensor module being configured by integrating a sensor such as a pressure sensor, a temperature sensor, an acceleration sensor and the like, a battery or a power generation element and a wireless device, and in which a condition of a running tire such as a tire inner pressure is detected and sensor information thus detected is transmitted to a vehicle side (for example, refer to Patent Literature 1).

CITATION LIST

Patent Literature

Patent Literature 1: Japanese Unexamined Patent Application Publication No. 2015-160512

SUMMARY OF THE INVENTION

Technical Problem

Incidentally, because distortion is generated repeatedly on the inner surface of the tire during traveling, there may be a case in which a sensor case and a base drop off from the inner surface of the tire due to a crack generated in an adhesion layer between the base and the inner surface of the tire, or a case in which the sensor case comes off from the base due to a crack generated between a housing part and a bottom surface of the base.

As illustrated in FIG. 8, when a sensor case 50 comes off from a base 20 and collides with an inner surface of a tire 30 or rolls on the inner surface of the tire 30, a corner part 50K of the sensor case 50 comes in contact with the inner surface of the tire 30. Thus, there has been a problem that the inner surface of the tire 30 is damaged, that is, as shown in FIG. 9A, a ridge part 31R of an inner liner 31, which is the inner surface of the tire 30, is scraped, or as shown in FIG. 9B, a scratch mark is caused in a portion that is not scraped.

The present invention has been made in view of the conventional problem and aims at providing a sensor case having a shape that does not damage an inner surface of a tire even if the sensor case comes off from the inner surface of the tire or from a base and rolls on the inner surface of the tire.

Solution to Problem

The present invention provides a sensor case with a sensor housed therein for obtaining information on a tire, the sensor case including: a lower side member having a bottom surface to be attached on an inner surface of the tire or to a base for mounting the sensor case on the inner surface of the tire; and an upper side member protruding from a surface opposite to the bottom surface of the lower side member to a side opposite to the bottom surface, in which a side surface of the lower side member is formed of a curved surface convex outwardly in a width direction, and a side surface of the upper side member and a top surface of the upper side member, which is a surface opposite to the bottom surface, are connected by a curved surface being in contact with the top surface.

BRIEF DESCRIPTION OF THE DRAWINGS

FIGS. 5A and 5B are diagrams illustrating results of the drum test.

FIGS. 6A and 6B are diagrams illustrating another example of the sensor case according to the present invention.

DESCRIPTION OF EMBODIMENT

An embodiment of the present invention is described with reference to the attached drawings.

Figure 1:
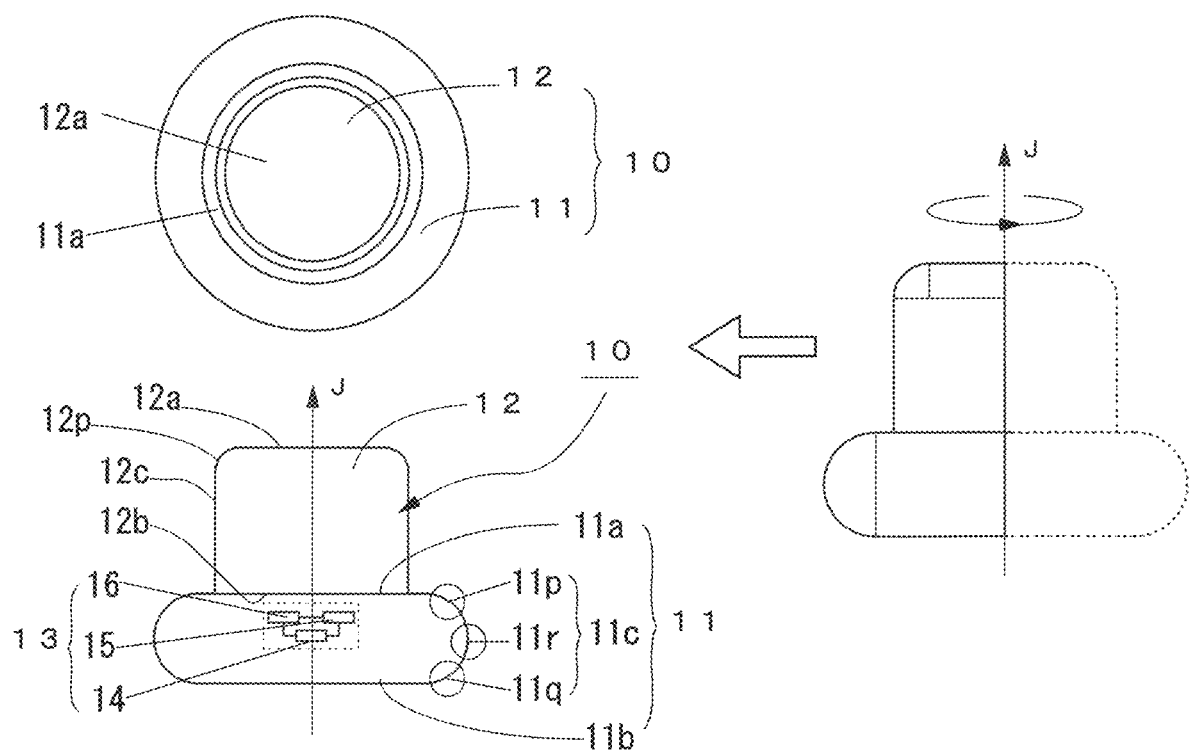
FIG. 1 is a diagram illustrating a sensor case according to an embodiment of the present invention.
Figure 2:
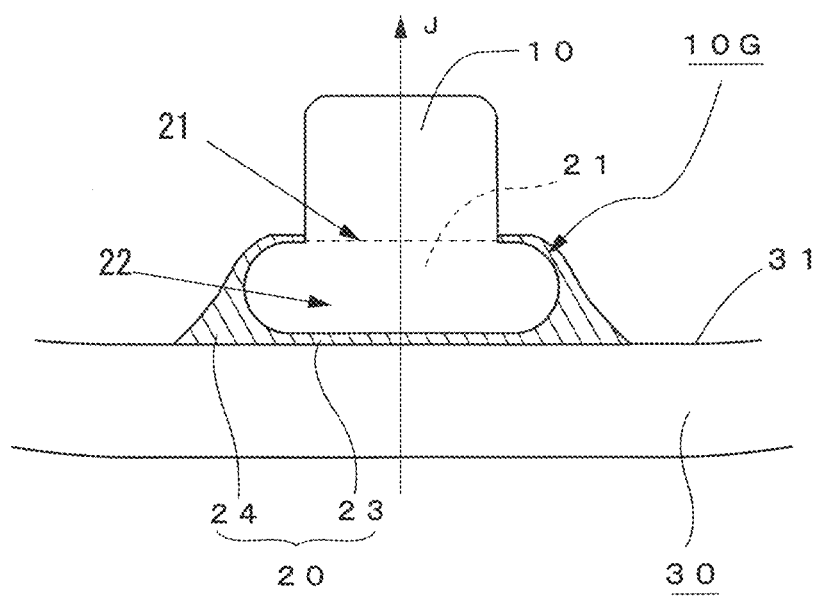
FIG. 2 is a sectional view of the sensor case with a rubber base according to the embodiment of the present invention.

FIG. 1 illustrates a sensor case 10 according to the present invention, and FIG. 2 is a sectional view of the sensor case attached to a rubber base 20 (hereinafter referred to as a sensor case 10G with a rubber base).

The sensor case 10 includes a housed part 11 to be housed in the rubber base 20, a holding part 12 formed so as to protrude from the housed part 11, and a sensor module 13.

The sensor module 13 is configured by integrating a sensor 14 for measuring a temperature, a pressure, a vibration and the like of the inside of a tire, a power generation element 15 as a power source and a wireless device 16 for transmitting data detected by the sensor 14, and is built in at least one of the housed part 11 and the holding part 12.

Hereinafter, it is assumed that a protruding direction of the holding part 12 is an upper side, a direction opposed to the protruding direction is a lower side, and right-and-left direction in the figures is a width direction. The lower side is an inner surface (here, which is an inner liner 31) side of a tire 30 when the sensor case 10G with the rubber base is attached.

The sensor case 10 of the present example is so formed that a maximum width of the housed part 11 is larger than a width of the holding part 12. Namely, the housed part 11 corresponds to a lower side member and the holding part 12 corresponds to an upper side member of the present invention.

Hereinafter, it is assumed that an upper side surface of the housed part 11 is an upper surface 11a, a lower side surface is a bottom surface 11b of the housed part 11, an upper surface of the holding part 12 is a top surface 12a and a lower surface of the holding part 12 is a connecting surface 12b.

The housed part 11, which is a lower side member, is configured, as illustrated in the right side figure of FIG. 1, by a rotational body formed by rotating a half of a rounded rectangle (truck-shaped figure) about a center axis J. Accordingly, the upper surface 11a and the bottom surface 11b of the housed part 11 become plane surfaces and the side surface 11c becomes a curved surface convex outwardly in the width direction. The shape of the side surface 11c is a half circle when cut on a plane passing the center axis J.

That is, with respect to the housed part 11 of the sensor case 10, the side surface 11c and the upper surface 11a of the housed part 11 are connected by a curved surface 11p being in contact with the upper surface 11a, the side surface 11c and the bottom surface 11b are connected by a curved surface 11q being in contact with the bottom surface 11b, and a maximum width part of the side surface 11c is formed by a curved surface 11r convex outwardly in the width direction.

On the other hand, with respect to the holding part 12, which is the upper side member, an upper left part of a rectangle-shape figure is formed by a rotational body formed by rotating, about the center axis J, an arc shaped figure whose circumferential angle is 90 degrees. Accordingly, the top surface 12a and the connecting surface 12b of the holding part 12 become plane surfaces, and the columnar side surface 12c and the top surface 12a are connected by the curved surface formed by rotating, about the center axis J, an arc which is a curved surface being in contact with the top surface 12a and whose circumferential angle is 90 degrees.

The rubber base 20, which is a rubber-made member, has an opening part 21 for inserting the housed part 11 of the sensor case 10 and a housing concave portion 22 for housing the housed part 11 of the sensor case 10. The rubber base 20 further includes a planar bottom part 23 which is adhered to an inner liner 31 of the tire 30 and a sidewall part 24 which connects the bottom part 23 and the opening part 21.

The sidewall part 24 is a tubular member having a concave part of a rotational body shape whose sectional shape is rounded rectangle when cut at a plane parallel to the center axis J. An outer circumferential surface of the sidewall part 24 is formed so as to go away from the center axis J as it goes toward a bottom part 23 side. An inner wall of the sidewall part 24 and an inner wall of the bottom part 23 form a housing concave part 22 having the same shape as the housed part 11 of the sensor case 10.

Figure 3:
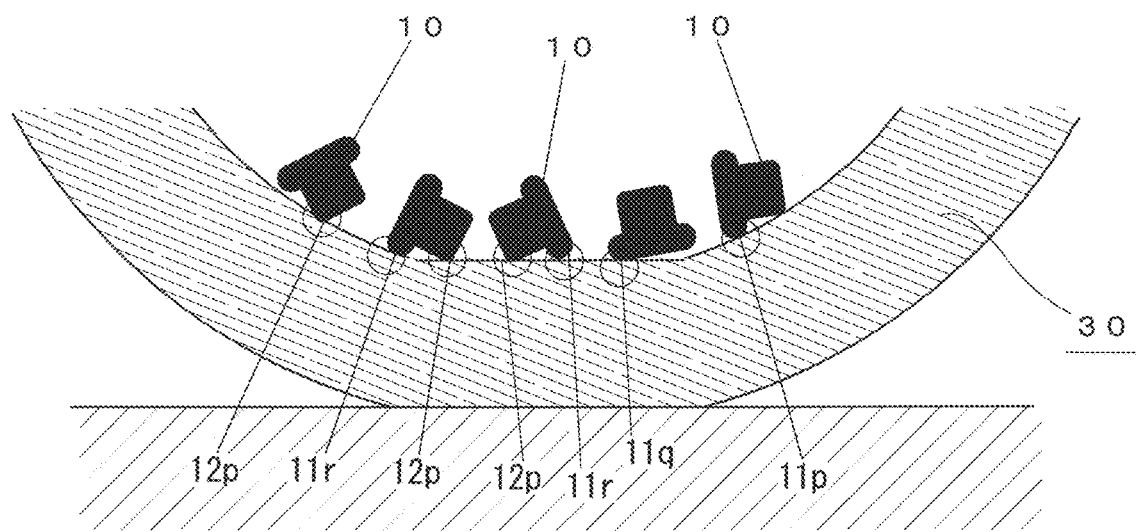
FIG. 3 is a schematic diagram illustrating a contact state of the sensor case having come off from the base with respect to an inner surface of a tire.

Since the sensor case 10 of the present invention has the above-described shape, even when the sensor case 10 comes off from the base 20 due to a crack generated between the bottom part 23 and the side wall part 24 of the base 20 and rolls on the inner surface of the tire 30, because, as illustrated in FIG. 3, parts (11p, 11q, 11r, 12p) that contact with the surface of the inner liner 31, which is the inner surface of the tire 30, are all curved surfaces, no scratch mark is made on the inner surface of the tire 30 or the inner surface of the tire 30 is not scraped. Namely, with the use of the sensor case 10 of the present invention, it is possible to prevent the inner surface of the tire 30 from being damaged even when the sensor case 10 comes off from the base and rolls on the inner surface of the tire 30.

Even when the sensor case 10 comes off, together with the base 20, from the inner surface of the tire and rolls on the inner surface of the tire, the inner surface of the tire 30 is not damaged because the holding part 12 exposed from the base 20 is connected at the columnar side surface 12c and the top surface 12a by the curved surface 12p being in contact with the top surface 12a.

EMBODIMENT

Figure 4:
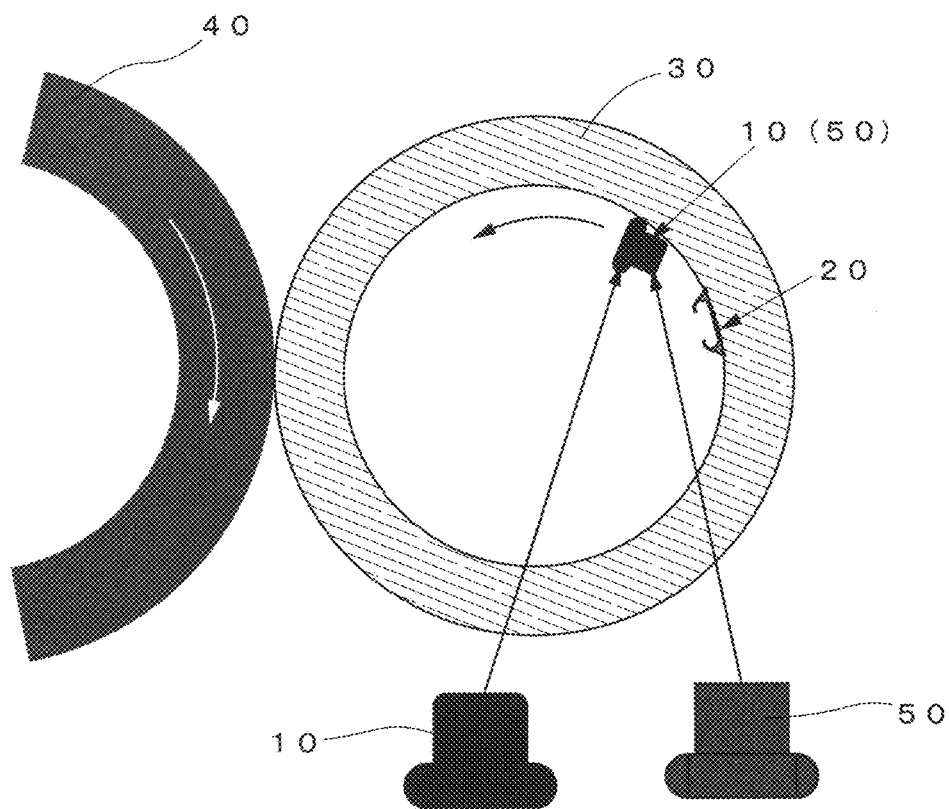
FIG. 4 is a diagram illustrating a test method (drum test) for grasping affect on the inner surface of the tire due to drop-off of the sensor case.

As illustrated in FIG. 4, after the base 20 having the sensor case 10 of the present invention inserted therein was fixed on the inner surface of the tire by an adhesion agent, a drum test was conducted by rotating the tire 30 at a rotational speed of 60 while pressing the tire 30 onto a drum 40 to check a surface condition of an inner liner after running of 5000.

The test was conducted with a tire size of 195/65R15, an inner pressure of 230 and a load of 615.

The sensor case 10 of the present invention is one as illustrated in FIG. 1. For comparison, the same test was conducted for a sensor case 50 whose holding part 12 was made to be a columnar shape (comparative example).

The test was conducted in a state that the sensor case 10, 50 are likely to come off from the base 20 under such a condition that a weight of the sensor case was 20 g and a height of the sidewall part 24 of the base 20 was made half, and so on. A cut may be made in advance between the bottom part 23 and the sidewall part 24 of the base 20 so as to make the sensor cases 10, 50 to easily come off from the base 20.

Test results are shown in FIGS. 5A and 5B.

FIG. 5A shows a test result of the sensor case 10 of the present invention and FIG. 5B shows a test result of the sensor 50 whose holding part 12 was made to be columnar shape.

In the sensor case 10 of the present invention shown in FIG. 5A, scrape and scratch were not found on the inner liner surface, whereas, in the comparative example shown in FIG. 5B, not only a ridge part of the inner liner was scraped in a rotation direction, but also a scratch mark was found in a part where scrape was not found.

From the above, it has been confirmed that, if the part of the sensor case being in contact with the inner surface of the tire was made to be a curved surface, it is possible to prevent the inner surface of the tire from being damaged even if the sensor case comes off from the base and rolls on the inner surface of the tire.

The embodiment and example of the present invention have been described, however, it should be noted that the technical scope of the present invention is not limited to the scope described in the embodiment. It is apparent for a person with ordinary skill in the art that various changes and modifications may be made to the embodiment described above. It is also apparent from the scope of the claims that such changes and modifications may be included in the technical scope of the present invention.

For example, in the above-described embodiment, a case in which the sensor case 10 is attached to the base 20 has been described, however, even in a case in which the sensor case 10 is attached on the inner surface of the tire, if the sensor case 10 is of the embodiment of the present invention, it is needless to say that the inner surface of the tire is not damaged even if the sensor case 10 comes off from the inner surface of the tire and rolls on the inner surface of the tire.

In the above-described embodiment, as illustrated in FIG. 6A, the side surface 12c and the top surface 12a of the holding part 12 are connected by the curved surface 12p being in contact with the side surface 12c and the top surface 12a and having an arc-shaped section with a circumferential angle of 90 degrees. However, as illustrated in FIG. 6B, a gradient of tangent A at a connecting point with the top surface 12a of the curved surface 12p may not completely coincide with a gradient of tangent B at a connecting point with the curved surface 12p of the top surface 12a, but it is sufficient that an angle made between the two tangents A and B is within a range from 0 degrees to 15 degrees.

Figure 7A:
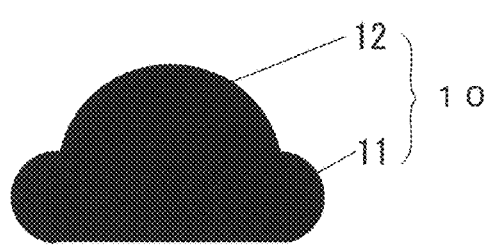
FIGS. 7A to 7D are diagrams illustrating another example of the sensor case according to the present invention.
Figure 7B:
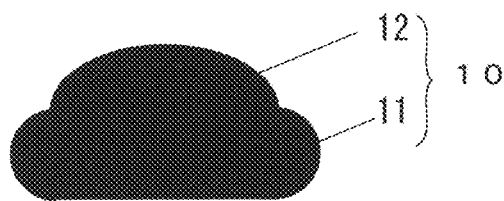

Furthermore, in the above-described embodiment, the holding part 12, which is the upper side member, is made to be columnar shape and the columnar side surface 12c and the top surface 12a are connected by the curved surface, however, as illustrated in FIGS. 7A and 7B, the sensor case 10 may be further small-sized if the holding part 12 is made to be a part of a sphere.

Figure 7C:
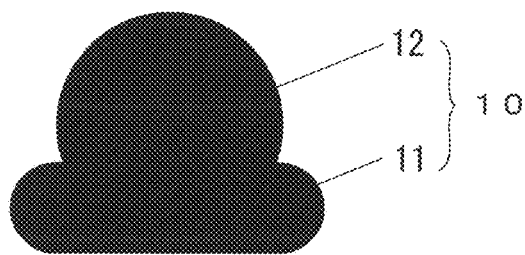
Figure 7D:
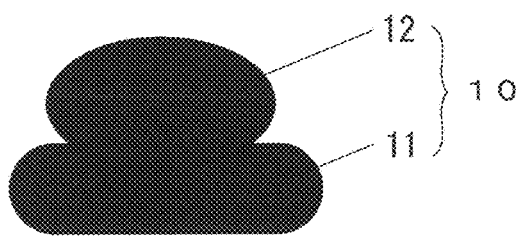
Figure 8:
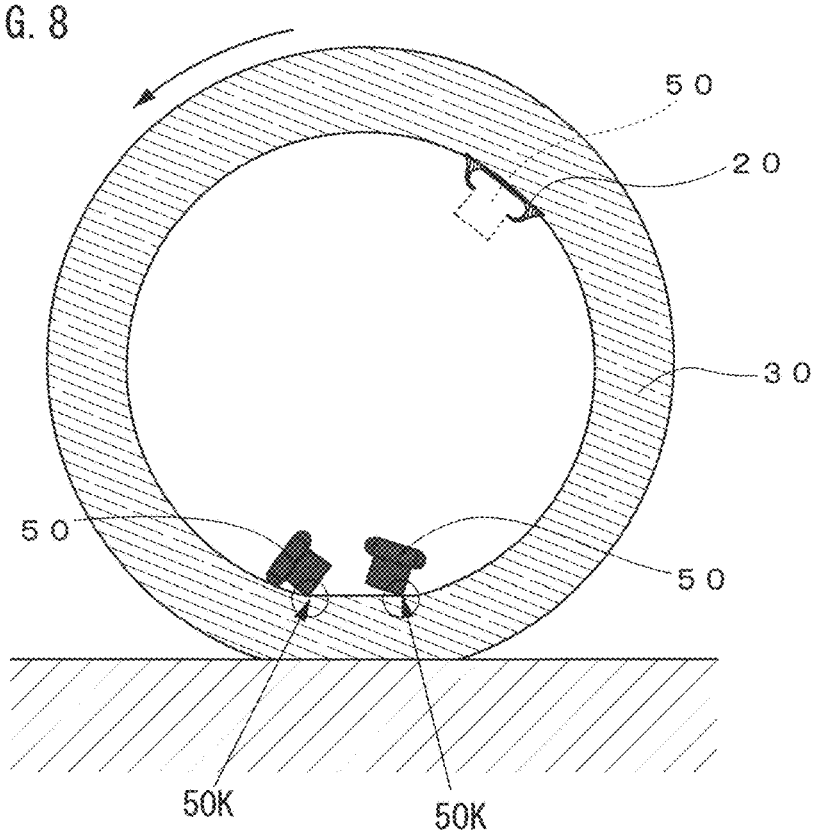
FIG. 8 is a schematic diagram illustrating a drop-off state of the sensor case.
Figure 9A:
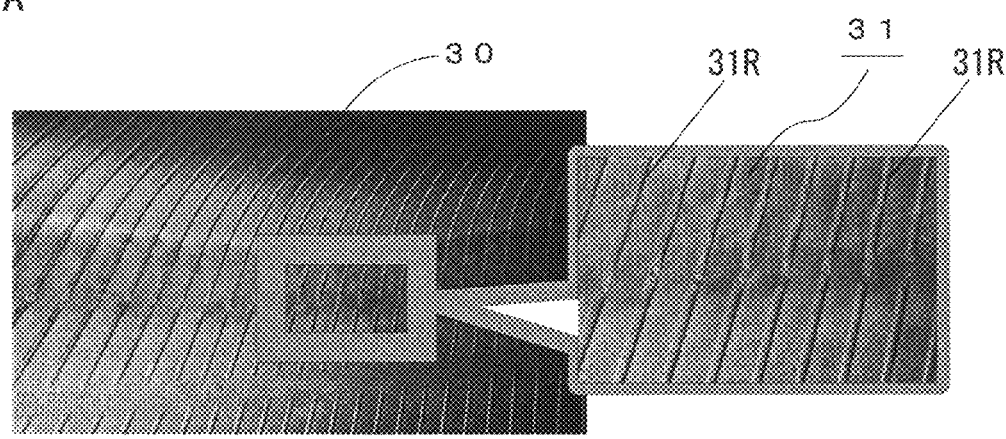
FIGS. 9A and 9B are diagrams showing examples of damage on the inner surface of the tire due to drop-off of the sensor case.
Figure 9B:
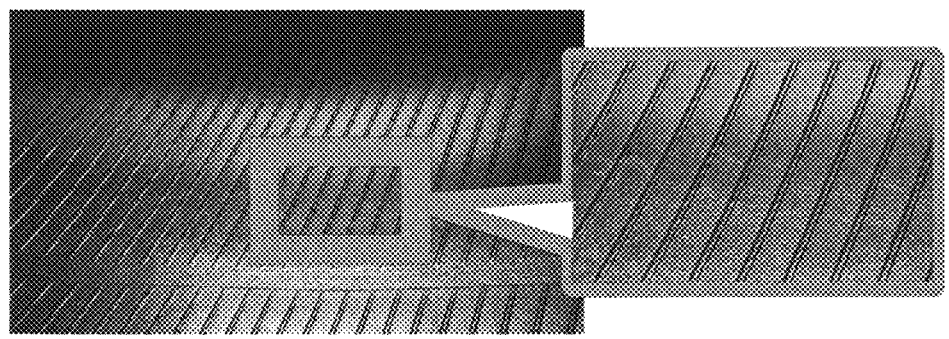

Furthermore, as illustrated in FIGS. 7C and 7D, the sensor case may be further holdable if the upper side member is made to be a sphere, or equal to or greater than 2/3 of a spheroid.

The embodiment of the present invention has been described, however, the present invention may be summarized as follows. That is, the present invention relates to a sensor case with a sensor housed therein for obtaining information on a tire, the sensor case including: a lower side member having a bottom surface to be attached on an inner surface of the tire or to a base for mounting the sensor case on the inner surface of the tire; and an upper side member protruding from a surface opposite to the bottom surface of the lower side member to a side opposite to the bottom surface, in which a side surface of the lower side member is formed of a curved surface convex outwardly in a width direction, and a side surface of the upper side member and a top surface, which is a surface opposite to the bottom surface of the upper side member, are connected by a curved surface being in contact with the top surface.

As such, since the part of the sensor case, which contacts with the inner surface of the tire when the sensor case comes off form the inner surface of the tire or from the base and rolls on the inner surface of the tire, is made to be a curved surface, it is possible to prevent the inner surface of the tire from being damaged. Further, the inner surface of the tire is not damaged for the reason similar to the reason described above, even if the sensor case comes off, together with the base, from the inner surface of the tire and rolls on the inner surface of the tire.

Further, since the side surface and the bottom surface of the lower member are connected by a curved surface being in contact with the bottom surface, and the side surface of the lower member and an upper surface, which is the surface opposite to the bottom surface of the lower member, are connected by the curved surface being in contact with the upper surface, even in a case in which the sensor case collides with the inner surface of the tire, it is possible to present the inner surface of the tire from being damaged.

Furthermore, since the upper side member is a part of a sphere or a part of a spheroid, the sensor case can be small sized. If the upper side member is made to be a sphere, or equal to or greater than ⅔ of a spheroid, the sensor case may be made further holdable.

REFERENCE SIGNS LIST

10: sensor case
20: rubber base
10G: sensor case with rubber base
11: housed part
12: holding part
13: sensor module
14: sensor
15: power generation element
16: wireless device
30: tire
31: inner liner

The invention claimed is:

1. A sensor case with a sensor housed therein for obtaining information on a tire, the sensor case comprising:
   a lower side member being a rotational body formed by rotating a half of a rounded rectangle about a center axis and having a bottom surface to be attached on an inner surface of the tire or to a base for mounting the sensor case on the inner surface of the tire; and
   an upper side member protruding from a surface opposite to the bottom surface of the lower side member to a side opposite to the bottom surface and having a width smaller than a width of the lower side member, the upper side member being a part of a sphere or a part of a spheroid, wherein
   a side surface of the lower side member is formed of a curved surface convex outwardly in a width direction at a maximum width portion of the lower side member, and
   a side surface of the upper side member and a top surface of the upper side member,
   which is a surface opposite to the bottom surface, are connected by a curved surface being in contact with the top surface.

2. The sensor case according to claim 1, wherein
   the side surface and the bottom surface of the lower side member are connected by a curved surface being in contact with the bottom surface, and
   the side surface of the lower side member and an upper surface of the lower side member,
   which is a surface opposite to the bottom surface of the lower side member, are connected by a curved surface being in contact with the upper surface.

3. The sensor case according to claim 1, wherein the upper side member is a sphere or equal to or greater than two-thirds of a spheroid.

4. The sensor case according to claim 2, wherein the upper side member is a sphere or equal to or greater than two-thirds of a spheroid.

5. The sensor case according to claim 1, wherein the side surface of the lower side member is formed of the curved surface convex outwardly in the width direction at the maximum width portion of the lower side member, the shape of the side surface being a half circle when cut on a plane passing a center axis.

6. The sensor case according to claim 2, wherein the side surface of the lower side member is formed of the curved surface convex outwardly in the width direction at the maximum width portion of the lower side member, the shape of the side surface being a half circle when cut on a plane passing a center axis.

7. The sensor case according to claim 3, wherein the side surface of the lower side member is formed of the curved surface convex outwardly in the width direction at the maximum width portion of the lower side member, the shape of the side surface being a half circle when cut on a plane passing a center axis.

8. The sensor case according to claim 4, wherein the side surface of the lower side member is formed of the curved surface convex outwardly in the width direction at the maximum width portion of the lower side member, the shape of the side surface being a half circle when cut on a plane passing a center axis.

* * * * *